United States Patent
Sakai et al.

(10) Patent No.: US 6,929,973 B2
(45) Date of Patent: Aug. 16, 2005

(54) METHOD OF PACKAGING ELECTRONIC COMPONENTS WITH HIGH RELIABILITY

(75) Inventors: Hiroshi Sakai, Tokyo (JP); Motoji Suzuki, Tokyo (JP); Makoto Igarashi, Niigata (JP); Akihiro Tanaka, Niigata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/155,089

(22) Filed: May 28, 2002

(65) Prior Publication Data

US 2002/0185304 A1 Dec. 12, 2002

(30) Foreign Application Priority Data

Jun. 1, 2001 (JP) ........................................ 2001-167023

(51) Int. Cl.[7] .......................... H01L 21/44; H01L 21/48; H01L 21/50

(52) U.S. Cl. ........................................ 438/106; 438/118

(58) Field of Search ........................ 438/51, 106, 108, 438/110, 113, 118, 464

(56) References Cited

U.S. PATENT DOCUMENTS 5,316,788 A * 5/1994 Dibble et al. ................. 427/98
5,390,080 A * 2/1995 Melton et al. ............... 361/765
5,844,249 A * 12/1998 Takano et al. ............ 356/237.1
6,296,174 B1   10/2001 Chiang

FOREIGN PATENT DOCUMENTS

JP          8-64942          3/1996
JP          9-186445         7/1997

OTHER PUBLICATIONS

Copy of European Search Report dated Apr. 20, 2004.

Vincent et al., GEC Journal of Research, vol. 11, No. 2, pp. 76–89 (1994).

* cited by examiner

Primary Examiner—Phuc T. Dang
(74) Attorney, Agent, or Firm—Dickstein, Shapiro, Morin & Oshinsky, LLP.

(57) ABSTRACT

An electronic component that is provided with leads at a narrow pitch that are plated with solder is packaged by soldering the leads to lands on a printed circuit board on which the lands have been formed in a pattern of arrangement that corresponds to said leads. When packaging, solder paste is printed over areas on the lands that are greater in area than the area of the lands. The leads are then placed on this solder paste, and the solder paste is subjected to reflow to solder the leads onto the lands.

7 Claims, 5 Drawing Sheets

METHOD OF PACKAGING ELECTRONIC COMPONENTS WITH HIGH RELIABILITY

BACKGROUND OF THE INVENTION

1. Field of the Invention

The present invention relates to a method of mounting various types of electronic components on a printed circuit board (PCB) by means of solder, and in particular, to a method of mounting electronic components on a PCB using a reflow soldering method 2. Description of the Related Art Conventionally, soldering has been used as a method of mounting electronic components on a PCB. Referring now to FIG. 1, a method of mounting electronic components using solder is next described. The example here explained pertains to double-sided reflow in which reflowing is performed to apply solder on both surfaces of a PCB.

Solder paste is first printed on lands that are provided on the PCB (Step 101). A summary of this printing process is shown in FIGS. 2A to 2C.

In this process, metal mask 13 is first arranged on PCB 15 as shown in FIG. 2A. Openings 12 of the same dimensions as lands 14 are formed in metal mask 13 in a pattern of arrangement that corresponds to the pattern of arrangement of lands 14 that are provided on the PCB. Metal mask 13 is then arranged such that openings 12 of metal mask 13 are each positioned over lands 14 of PCB 15.

Solder 11 is then rolled and moved across metal mask 13 by printing squeegee 10, whereby openings 12 in metal mask 13 are filled with solder 11 as shown in FIG. 2B. After filling openings 12 with solder 11, metal mask 13 is removed from PCB 15 as shown in FIG. 2C. Solder paste is thus printed on the lands.

Chip components, in particular, a surface-mount component such as a QFP (Quad Flat Package) or an SOP (Small Outline Package), are next mounted on the printed solder paste (Step 102). FIG. 3 shows a perspective view of PCB 15 and QFP chip 1 mounted on this PCB 15 at this time, and FIG. 4 shows a plan view of an area of this PCB 15 in which lands 14 are formed.

QFP chip 1 is provided with a plurality of leads 2 at a narrow pitch. Lands 14 of PCB 15 are provided at positions corresponding to leads 2. Solder 11 is applied to lands 14 in the above-described Step 101. Solder 11 is applied in regions having the same area as lands 14 as shown in FIG. 4 by printing using metal mask 13 in which openings 12 having the same dimensions as lands 14 have been formed as described hereinabove. QFP chip 1 is mounted such that each lead 2 rests upon each of regions on which this solder 11 has been applied.

The PCB on which the surface-mount component has been loaded is passed through a high-temperature reflow furnace, whereby the solder paste melts and the leads of the surface-mount component are soldered to the lands of the PCB (Step 103). The processes to this point complete the packaging of one side of the PCB. The PCB is next turned over such that the side on which components have not been packaged is directed upward (Step 104).

Solder paste is next printed (Step 105) and components are loaded (Step 106) as in Steps 101 and 102. Next, through-holes (T/H) components, which are components that are configured for mounting such that leads pass through T/H that have been formed in the PCB, are loaded (Step 107). The PCB is then passed through a reflow furnace as in Step 103 to solder the components (Step 108). Finally, components that cannot withstand the high temperature of the reflow furnace are manually soldered (Step 109), whereby the packaging of electronic components to the PCB is completed.

In the prior-art method of packaging electronic components that has been described above, tin-lead (Sn—Pb) solder is typically used as solder 11. However, this tin-lead solder contains lead, a toxic heavy metal, and this raises the problem of damage to the global environment that results from inappropriate disposal of used electronic equipment. As a solution to this problem, the use of lead-free solder has become preferable in recent years to prevent pollution of the environment.

Tin-silver (Ag) solder is well known as such a lead-free solder. Due to the stable characteristics of silver, the use of this tin-silver solder in place of tin-lead solder for packaging electronic components enables packaging of electronic components while maintaining the same level of reliability as in the prior art. However, the melting point of tin-silver solder is approximately 220° C., which is much higher than the approximately 183° C. melting point of tin-lead solder. For this reason, simply using tin-silver solder to carry out packaging that was performed using tin-lead solder is problematic, and further, simply using equipment without modification that was used in packaging with tin-lead solder to perform packaging with tin-silver solder is also problematic. In particular, when melting tin-silver solder having a melting point of 220° C. in a reflow furnace to perform soldering, the electronic components may in some cases reach temperatures in excess of 240° C. The temperature endurance of a typical electronic component is approximately 230° C. Thus, when tin-silver solder is used to package an electronic component, there is the problem that the temperature endurance of the various electronic components that are used must be raised.

Besides tin-silver solder, which has a high melting point, tin-zinc (Sn—Zn) solder is also known as a lead-free solder. The melting point of this tin-zinc solder is approximately 197° C., and this tin-zinc solder can therefore be used to package prior-art electronic components without modifying the equipment of the prior art.

When lead-free tin-zinc solder is used as solder 11, the solder bonding portions can be made sufficiently strong if an electronic component is used that has leads that are plated with a lead-free material.

If, on the other hand, an electronic component having leads that are plated with a solder containing lead is packaged on a PCB using lead-free tin-zinc solder, and in particular, if the electronic component to be packaged is an electronic component that is provided with leads at a narrow pitch such as a QFP or an SOP, the lead that is contained in the solder that is used in the plating is segregated at the interface of the lands in the reflow process. This segregation further progresses when the reflow process is again carried out when packaging on the opposite surface. The lead that has become segregated in this way forms a layer of low strength at the interface of the lands.

Due to this weak layer, when warping and twisting in the PCB 15 have occurred during subsequent fabrication processes and so on, the solder strength of the leads of electronic components is compromised, and the peeling away of the leads is further encouraged. Stress tends to concentrate at leads at the corners of an electronic component, and the solder strength in these areas is particularly reduced, resulting in a greater tendency for leads to peel away.

As described in the foregoing explanation, when a prior-art electronic component such as a QFP or SOP having leads that are provided at a narrow pitch and that are plated with solder containing lead (Pb) is packaged on a PCB using lead-free solder as a solder paste, it is difficult to obtain adequate bonding strength.

SUMMARY OF THE INVENTION

It is an object of the present invention to provide a method of packaging an electronic component that can sufficiently increase the strength at portions that are bonded by solder even when using a lead-free solder to package an electronic component that is provided with leads at a narrow pitch that are plated with a solder that contains lead (Pb). It is an object of the present invention to sufficiently increase the strength of portions that have been joined by soldering so as to prevent loss of soldering strength of leads or peeling away of leads, particularly in the corner portions of an electronic component, and to enable packaging of electronic components with high reliability.

To achieve these objects, the present invention employs a metal mask in which at least one opening for printing solder paste has greater area than the corresponding land. As a result, the amount of solder paste that fills an opening of enlarged area is increased. Accordingly, even if the lead that is soldered onto the land that corresponds to this enlarged opening is plated with solder that contains lead (Pb) and this lead (Pb) should melt into the bonded portion, the proportion of this lead (Pb) to the total amount of solder that solders the lead can be reduced. The method of packaging an electronic component according to the present invention therefore mitigates the influence caused by a layer of low strength that contains lead (Pb), and can prevent the lessening of the strength of the soldering of leads of an electronic component and can therefore prevent the peeling away of leads.

As described in the foregoing explanation, stress tends to concentrate in leads in the corner portions of an electronic component, i.e., in leads at the ends that are close to the corners. Enlarging the openings that correspond to lands to which these leads are soldered can effectively raise the reliability of packaging of the electronic component and is therefore preferable. In particular, enlarging only openings that correspond to lands that correspond to leads at the ends prevents the occurrence of solder bridges between leads, and is therefore preferable.

In addition, when the openings of a metal mask are enlarged and the areas in which solder paste is printed are accordingly enlarged, enlarging the area of lands that correspond to these openings enables an easy and increase in the area in which solder paste is printed without problems, and is therefore preferable.

The method of packaging an electronic component according to the present invention is particularly appropriate as a method of packaging that uses a tin-zinc (Sn—Zn) solder that does not contain lead (Pb) as the solder paste. In addition, the present invention is particularly appropriate as a method of packaging an electronic component such as a QFP and SOP that is provided with leads at a narrow pitch.

The above and other objects, features, and advantages of the present invention will become apparent from the following description with reference to the accompanying drawings, which illustrate examples of the present invention.

DETAILED DESCRIPTION OF THE PREFERRED EMBODIMENTS

The method of packaging an electronic component according to one embodiment of the present invention is next explained with reference to the accompanying drawings.

In this embodiment, a QFP is packaged on a PCB, this QFP being provided with a plurality of leads at a pitch of 0.4–0.8 mm, and each lead being plated with solder that contains lead (Pb). A PCB is used in which lands are formed in advance in a pattern of arrangement that corresponds to the leads of the QFP.

In the packaging process, a metal mask in which openings have been formed in a pattern of arrangement that corresponds to the lands is used to print solder paste on the PCB. At this time, lead-free tin-zinc (Sn—Zn) solder is used as the solder paste. As for the metal mask that is used, the sizes of the openings are larger than the lands.

Figure 1:
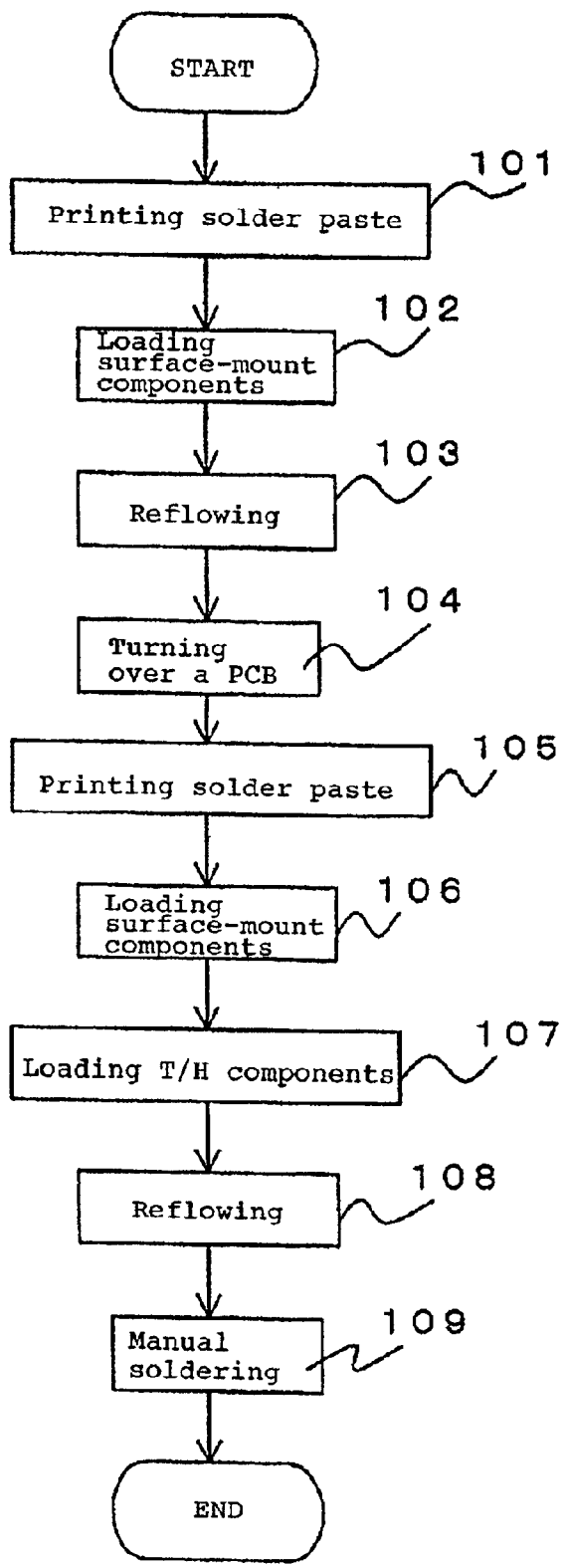
FIG. 1 is a flow chart of one example of a method of packaging an electronic component in which solder is used to package the electronic component.
Figure 2A:
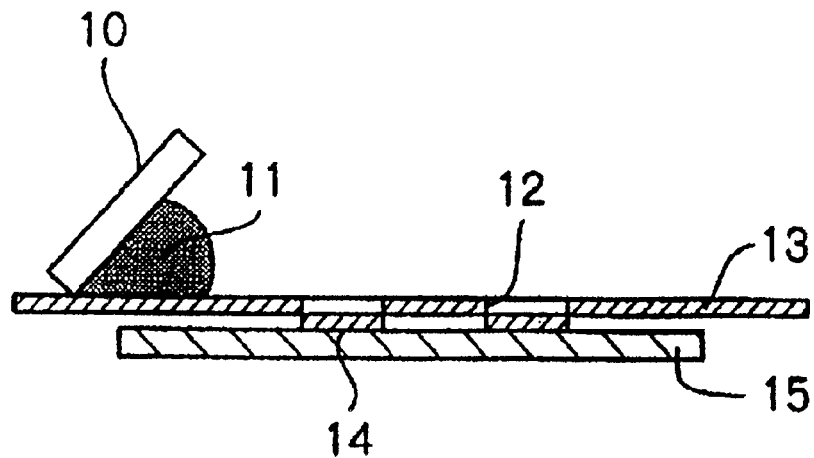
FIGS. 2A to 2C are schematic views showing the processes of printing solder paste onto lands that are provided on a PCB.
Figure 2B:
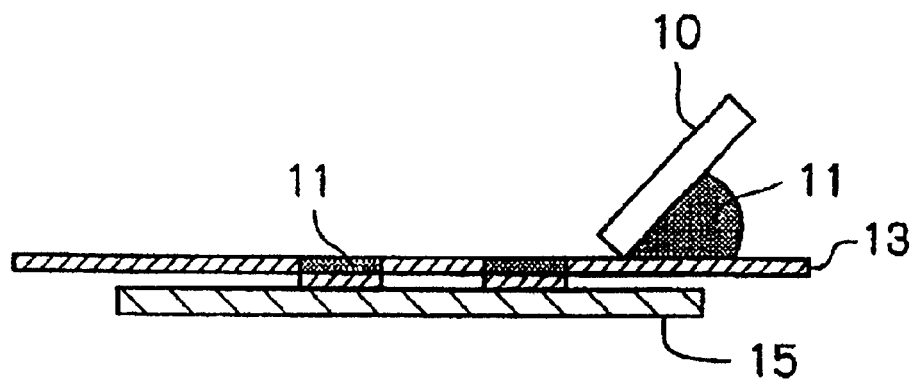
Figure 2C:
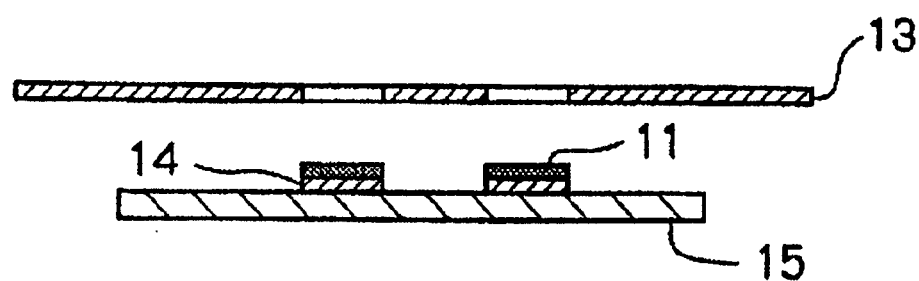
Figure 3:
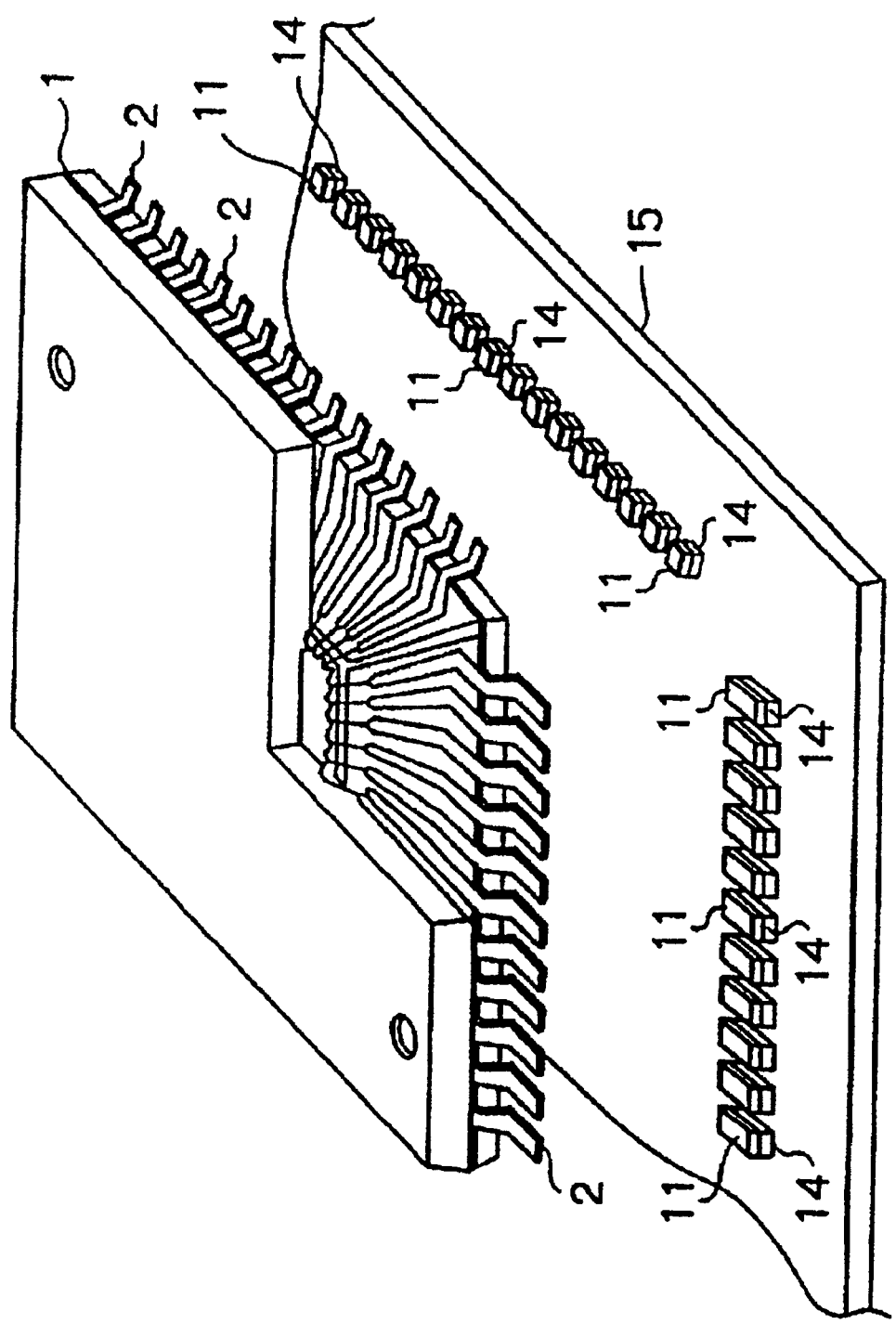
FIG. 3 is a perspective view of a PCB and QFP chip that is to be mounted on the PCB when mounting the QFP on the PCB.
Figure 4:
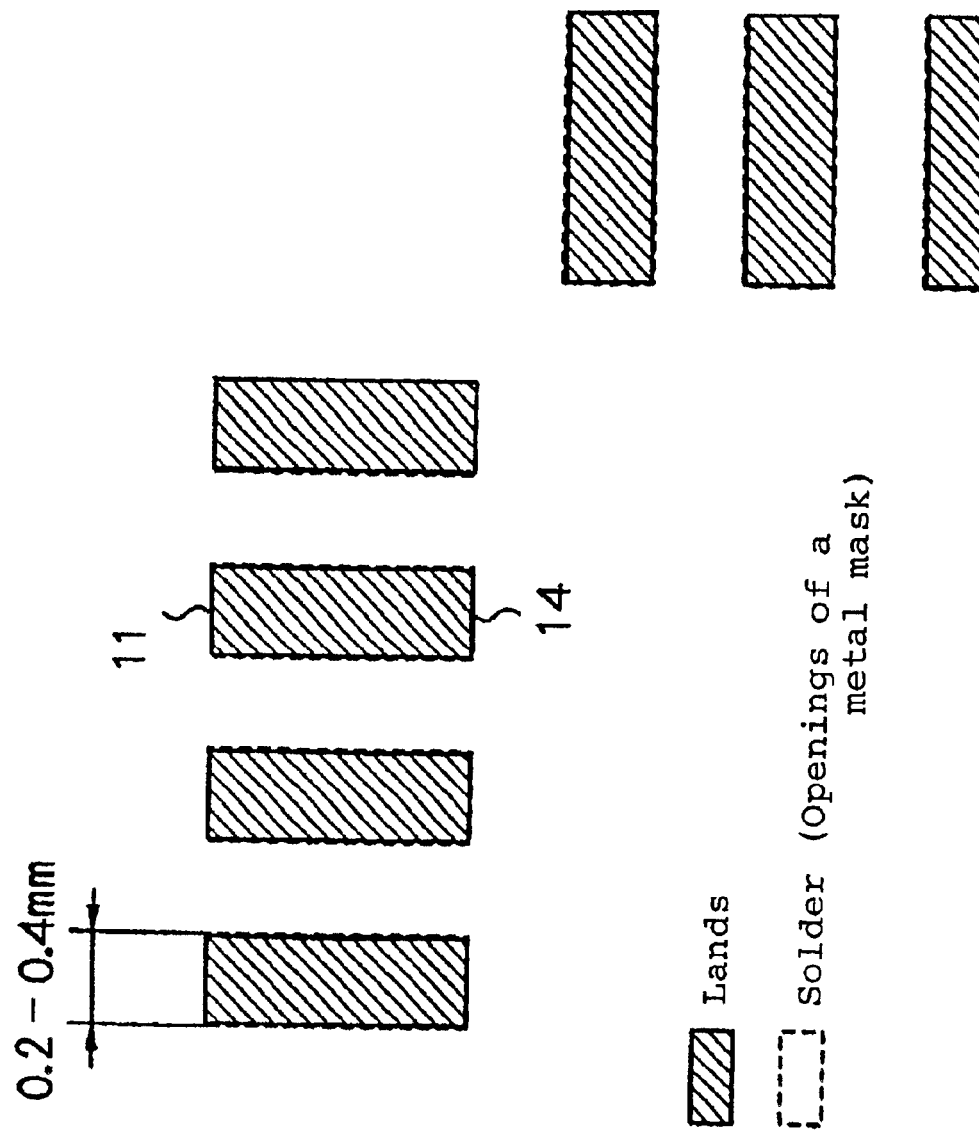
FIG. 4 is a plan view of a portion of the PCB of FIG. 3 in which lands have been formed.
Figure 5:
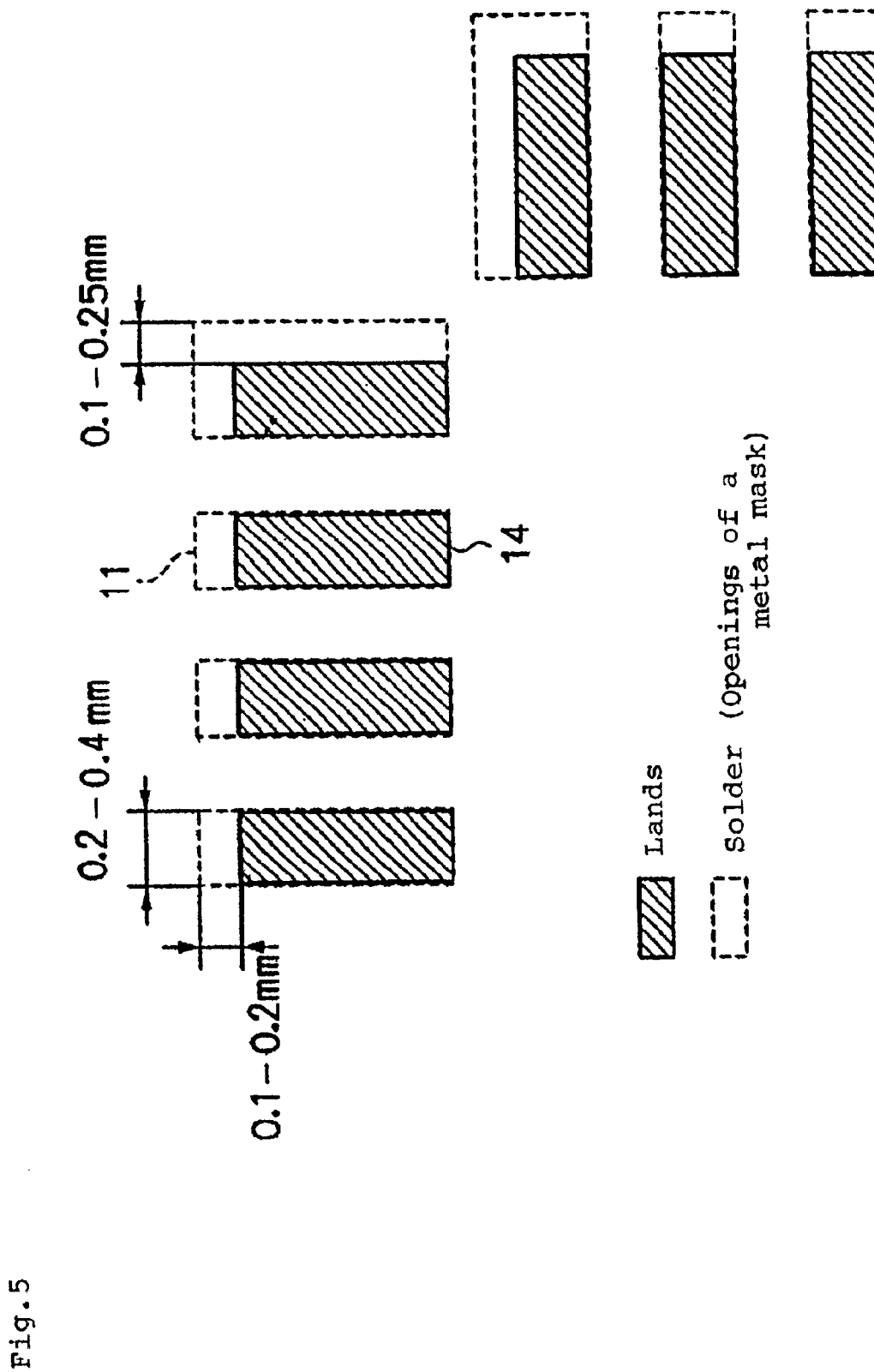
FIG. 5 is a plan view of a portion of the PCB in which lands have been formed when mounting a QFP chip onto a PCB in the method of packaging an electronic component according to one embodiment of the present invention.

FIG. 5 is a plan view of the PCB on which solder 11 is printed, showing a portion in which lands 14 are formed. Since a metal mask is used in which the sizes of the openings are larger than the lands, as described hereinabove, solder 11 is printed over areas that are larger than lands 14.

To describe more specifically, as can be understood from FIG. 5, a metal mask is used in which the length of each opening is 0.1–0.2 mm longer than the lands in the direction away from the QFP, this direction being perpendicular to the direction in which the leads are aligned on each side of the QFP, and accordingly, to the direction in which corresponding lands 14 are aligned on the PCB. In addition, the width, in the direction in which lands 14 are aligned, of the openings of the metal mask that are arranged at lands 14 that are to be bonded to leads that at the ends close to the corners of the QFP, i.e., to leads in the corner portions, is 0.1–0.25 mm greater in the direction toward the corners of the QFP than the 0.2–0.4-mm width of other lands 14.

The QFP is then mounted on the PCB to which solder 11 has been printed in this way, and this assembly is then passed through a reflow furnace to solder the QFP to the PCB.

As described in the foregoing explanation, making the area of openings of the metal mask that correspond to leads in the corner portions greater than the area of the lands in the method of packaging an electronic component of the present embodiment increases the amount of solder paste that fills the openings. Thus, even if solder that contains lead (Pb) is used to plate leads 2 and melts and mixes with the bonding portions in the reflow process, this method can reduce the proportion of the lead (Pb) to the total amount of solder that solders leads 2. The method of packaging an electronic component according to this embodiment therefore lessens the effect of low-strength layers that contain lead (Pb) and can thus prevent a loss of strength of the soldering of leads in corner portions of the QFP and prevent peeling away of leads.

Preferably, the areas of the openings of the metal mask are appropriately determined according to the amount of lead (Pb) that is contained in the solder that is used in plating the leads. Specifically, the areas of the openings of the metal mask are preferably determined such that the proportion of lead (Pb) to the total amount of solder is 1.0% or less, and more preferably, 0.9% or less.

In addition, as previously described, increasing the areas of the openings of the metal mask that correspond not only to leads in the corner portions of the QFP, but to other leads of the QFP enables an increase in the strength of the bonding portions of the leads, and is therefore preferable. However, because stress tends to concentrate at the leads of the corner portions of the QFP, and further, because the area of solder 11 that is printed corresponding to the leads of the corner portions is easy to enlarge, it is preferable to enlarge only the area of openings of the mask that correspond to leads of the corner portions of the QFP.

The areas of the metal mask in which openings are provided must be within a permissible range that is determined according to other formations on the PCB, and the occurrence of solder bridges between adjacent lands 14 must not be allowed. For this purpose, the openings of the metal mask are preferably not allowed to extend in the direction of adjacent lands 14, but in another direction. Specifically, as previously described, the openings of the metal mask preferably extend in a direction that is perpendicular to the direction in which lands 14 are aligned, and for openings corresponding to corner portions, preferably extend toward the corners.

In addition, in the method of packaging an electronic component according to the present embodiment, the area of land 14 that is soldered to at least one lead of the QFP may be made greater than the area of other lands 14. Making the area of lands 14 of corner portions of the QFP greater than the area of other lands 14 in this way allows the area of openings of the metal mask that correspond to corner portions of the QFP to be made still greater without any particular difficulty. The amount of solder in the corner portions of the QFP can therefore be further increased, thereby enabling an augmentation of the effect of strengthening the bonding portions.

Finally, the method of packaging an electronic component according to the present invention can be similarly applied when the electronic component to be soldered is an SOP.

While a preferred embodiment of the present invention has been described using specific terms, such description is for illustrative purposes only, and it is to be understood that changes and variations may be made without departing from the spirit or scope of the following claims.

What is claimed is:

1. A method for packaging an electronic component, in which leads that are plated with solder including lead (Pb) are provided at a narrow pitch, on a printed circuit board on which lands have been formed in a pattern of arrangement that corresponds to said leads wherein said leads are soldered to said lands, said method comprising:

preparing a metal mask in which openings are formed in a pattern of arrangement that corresponds to said lands;

arranging said metal mask on said printed circuit board such at said openings are each positioned on said lands;

filling said openings with a solder paste;

removing said metal mask;

mounting said electronic component on said printed circuit board such that said leads are each mounted on said solder paste; and causing reflow of said solder paste to solder said leads to respective said lands;

wherein at least one of said openings of said metal mask has greater larger area than the area of the corresponding one of said lands, and a proportion of lead (Pb) melted from said leads to the total amount of solder that solders said leads to said lands is controlled in a suitable range by adjusting areas of said openings.

2. A method for packaging an electronic component, in which leads that are plated with solder are provided at a narrow pitch, on a printed circuit board on which lands have been formed in a pattern of arrangement that corresponds to said leads wherein said leads are soldered to said lands, said method comprising:

preparing a metal mask in which openings are formed in a pattern of arrangement that corresponds to said lands;

arranging said metal mask on said printed circuit board such that said openings are each positioned on said lands;

filling said openings with a solder paste;

removing said metal mask;

mounting said electronic component on said printed circuit board such that said leads are each mounted on said solder paste; and causing reflow of said solder paste to solder said leads to respective said lands;

wherein at least one of said openings of said metal mask has a larger area than the area of the corresponding said land and wherein, as said metal mask, a metal mask is used in which the areas of said openings that correspond to said lands that are t be soldered to said leads that are at ends that are close to the corners of said electronic component are larger than the areas of the corresponding lands.

3. A method for packaging an electronic component, in which leads that are plated with solder are provided at a narrow pitch, on a printed circuit board on which lands have been formed in a pattern of arrangement that corresponds to said leads wherein said leads are soldered to said lands, said method comprising:

preparing a metal mask in which openings are formed in a pattern arrangement that corresponds to said lands;

arranging said metal mask on said printed circuit board such that said openings are each positioned on said lands;

filling said openings with a solder paste;

removing said metal mask;

mounting said electronic component on said printed circuit board such that said leads are each mounted on said solder paste; and causing reflow of said solder paste to solder said leads to respective said lands;

wherein at least one of said openings of said metal mask has a larger area than the area of the corresponding said land and wherein, as said printed circuit board, a printed circuit board is used in which the area of at least one of the plurality of said lands, to which are soldered the plurality of said leads of one said electronic component, is greater than the area of the other said lands.

4. A method for packaging an electronic component according to claim 1, wherein a tin-zinc (Sn—Zn) solder that does not lead (Pb) is used as said solder paste.

5. A method for packaging an electronic component according to claim 1, wherein said electronic component is a QFP (Quad Flat Package).

6. A method for packaging an electronic component according to claim 1, wherein said electronic component is an SOP (Small Outline Package).

7. A method for manufacturing a structure, in which an electronic component is mounted on a printed circuit board by soldering, in which leads that are plated with solder including lead (Pb) are provided at a narrow pitch, on a printed circuit board on which lands have been formed in a pattern of arrangement that corresponds to said leads wherein said leads are soldered to said lands, said method comprising:

preparing a metal mask in which openings are formed in a pattern of arrangement that corresponds to said lands, said metal mask controlling a total amount of solder that is melted from said leads in order to control a proportion of lead (Pb) to the total amount of solder that solders said leads to said lands;

arranging said metal mask on said printed circuit board such at said openings are each positioned on said lands;

filling said openings with a solder paste;

removing said metal mask;

mounting said electronic component on said printed circuit board such that said leads are each mounted on said solder paste; and causing reflow of said solder paste to solder said leads to respective said lands;

wherein at least one of said openings of said metal mask has larger area than the area of the corresponding said land.

* * * * *

UNITED STATES PATENT AND TRADEMARK OFFICE
CERTIFICATE OF CORRECTION

PATENT NO. : 6,929,973 B2
APPLICATION NO. : 10/155089
DATED : August 16, 2005
INVENTOR(S) : Hiroshi Sakai et al.

It is certified that error appears in the above-identified patent and that said Letters Patent is hereby corrected as shown below:

On the Title Page, Item (56), References Cited, under FOREIGN PATENT DOCUMENTS:

Please add:

JP 62-299098,   12/26/1987

JP 06-169153,   06/14/1994

JP 09-266373,   10/07/1997

JP 04-180290,   06/26/1992

JP 5-94958,     12/24/1993

Signed and Sealed this

Twenty-fourth Day of October, 2006

JON W. DUDAS
*Director of the United States Patent and Trademark Office*